United States Patent
Kim et al.

(10) Patent No.: US 8,736,018 B2
(45) Date of Patent: May 27, 2014

(54) SEMICONDUCTOR DEVICES AND METHODS OF MANUFACTURING SEMICONDUCTOR DEVICES

(75) Inventors: Kyoung-Hee Kim, Incheon (KR); Gil-Heyun Choi, Seoul (KR); Kyu-Hee Han, Hwaseong-si (KR); Byung-Lyul Park, Seoul (KR); Byung-Hee Kim, Seoul (KR); Sang-Hoon Ahn, Hwaseong-si (KR); Kwang-Jin Moon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/314,575

(22) Filed: Dec. 8, 2011

(65) Prior Publication Data
US 2012/0153500 A1    Jun. 21, 2012

(30) Foreign Application Priority Data

Dec. 16, 2010   (KR) .................. 10-2010-0128972

(51) Int. Cl.
*H01L 21/764*    (2006.01)
*H01L 21/00*    (2006.01)

(52) U.S. Cl.
USPC .......................................... 257/521; 438/411

(58) Field of Classification Search
CPC ............................ H01L 21/7682; H01L 21/764
USPC .......................................... 257/499; 438/400
See application file for complete search history.

(56) References Cited

U.S. PATENT DOCUMENTS

| | | | | |
|---|---|---|---|---|
| 5,571,751 A | * | 11/1996 | Chung | 438/625 |
| 6,492,245 B1 | * | 12/2002 | Liu et al. | 438/422 |
| 7,064,043 B1 | * | 6/2006 | Rouse | 438/396 |
| 7,306,972 B2 | | 12/2007 | Umemoto et al. | |
| 7,553,756 B2 | | 6/2009 | Hayashi et al. | |
| 7,868,376 B2 | * | 1/2011 | Aoyama et al. | 257/324 |
| 7,910,473 B2 | * | 3/2011 | Chen | 438/619 |
| 8,492,817 B2 | * | 7/2013 | Cheng et al. | 257/301 |
| 2010/0176494 A1 | * | 7/2010 | Chen | 257/621 |
| 2010/0270668 A1 | * | 10/2010 | Marcoux | 257/690 |
| 2011/0133335 A1 | * | 6/2011 | Chen | 257/737 |
| 2012/0013022 A1 | * | 1/2012 | Sabuncuoglu Tezcan et al. | 257/774 |

FOREIGN PATENT DOCUMENTS

KR   1020050071060   7/2005

* cited by examiner

*Primary Examiner* — Seahvosh Nikmanesh
*Assistant Examiner* — Evren Seven
(74) *Attorney, Agent, or Firm* — F. Chau & Associates, LLC

(57) ABSTRACT

A semiconductor device comprises a top surface having a first contact, a bottom surface having a second contact, a via hole penetrating a substrate, an insulation layer structure on a sidewall of the via hole, the insulation layer structure having an air gap therein, a through electrode having an upper surface and a lower surface on the insulation layer structure, the through electrode filling the via hole and the lower surface being the second contact, and a metal wiring electrically connected to the upper surface of the through electrode and electrically connected to the first contact.

5 Claims, 13 Drawing Sheets

SEMICONDUCTOR DEVICES AND METHODS OF MANUFACTURING SEMICONDUCTOR DEVICES

CROSS-REFERENCE TO RELATED APPLICATIONS

This application claims priority under 35 USC §119 to Korean Patent Application No. 10-2010-0128972 filed on Dec. 16, 2010 in the Korean Intellectual Property Office (KIPO), the contents of which are herein incorporated by reference in its entirety.

TECHNICAL FIELD

Exemplary embodiments relate to semiconductor devices and methods of manufacturing the semiconductor devices. More particularly, exemplary embodiments relate to semiconductor devices having a through electrode and methods of manufacturing the semiconductor devices.

DISCUSSION OF THE RELATED ART

In a multi-stacked semiconductor device, a plurality of semiconductor chips may be vertically stacked, securing a signal path interconnected with each other by a through electrode. For the signal path having better signal integrity at high frequency, the parasitic capacitance introduced by the through electrode is required to be minimized.

SUMMARY

In an embodiment of the inventive concept, a semiconductor device comprises a top surface having a first contact, a bottom surface having a second contact, a substrate having a via hole, an insulation layer structure on a sidewall of the via hole, the insulation layer structure having an air gap therein, a through electrode having an upper surface and a lower surface on the insulation layer structure, the through electrode filling the via hole and the lower surface being the second contact, and a metal wiring electrically connected to the upper surface of the through electrode and electrically connected to the first contact.

The insulation layer structure includes a first insulation layer on the sidewall of the via hole and a second insulation layer on the first insulation layer, and the air gap is defined between the first insulation layer and the second insulation layer. The first and second insulation layers include silicon oxide or carbon-doped silicon oxide. The air gap has a shape whose gap width gradually increases in a direction toward the bottom surface. The through electrode includes copper (Cu) or tungsten (W). An insulation interlayer covers a circuit pattern on the substrate and the via hole further penetrates the insulation interlyers. A barrier layer is disposed between the insulation structure and the through electrode.

In another embodiment of the inventive concept, a method of manufacturing a semiconductor device comprises a step of forming a circuit pattern on a substrate, a step of forming a via hole by etching the substrate to a predetermined depth, a step of forming an insulation layer structure on a sidewall of the via hole, the insulation layer structure having an air gap therein, and forming a through electrode that fills the via hole on the insulation layer structure.

A step of forming an insulation interlayer is comprised, the insulation interlayer covering the circuit pattern on the substrate. The step of forming a via hole further includes a step of etching the insulating interlayer to expose the substrate. The step of forming the insulation layer structure comprises a step of forming a first insulation layer on the insulating interlayer and on the sidewall and a bottom of the via hole, a step of forming a sacrificial layer pattern on a sidewall of the first insulation layer, a step of forming a second insulation layer on the first insulation layer and the sacrificial layer pattern, and a step of removing the sacrificial layer pattern.

The step of forming the sacrificial layer pattern comprises a step of forming a sacrificial layer on the first insulation layer, and a step of anisotropically etching the sacrificial layer. The sacrificial layer is formed using a hydrocarbon-based (CxHy) material. The sacrificial layer is formed using a terpine-based material or a norbornene-based material.

The step of removing the sacrificial layer pattern is performed by an ultraviolet (UV) radiation process with a thermal treatment or an electron beam radiation process for vaporizing the sacrificial layer pattern. The UV radiation process is performed using a light source having a wavelength of about 200 nm to about 350 nm at a temperature of about 300° C. to about 500° C. The first and second insulation layers are formed using tetra ethyl ortho silicate (TEOS) or ozone TEOS.

A step of forming a contact plug is performed after a step of forming the insulating interlayer. Father steps of manufacturing the semiconductor device includes a step of sequentially forming a buffer layer and an intermetallic dielectric layer on the through electrode and the insulating interlayer, and a step of forming a plurality of metal wirings electrically connected to the through electrode and the contact plug through the intermetallic dielectric layer and the buffer layer. A step of polishing the substrate is further included to expose a bottom side of the through electrode and a bottom side of the insulation layer structure. The step of forming a through electrode includes a step of forming a barrier layer on the insulation layer structure.

In another embodiment of the inventive concept, a multi-stacked semiconductor device comprises a first semiconductor device and a second device. The first device comprises a top surface, a bottom surface, a through electrode having an upper surface and an lower surface, wherein the lower surface is at the same level with the bottom surface, an insulation layer structure on a sidewall of the thorough electrode and having an air gap inside, and a first metal wiring electrically connected to the upper surface of the through electrode. The second semiconductor device comprise a contact pad having an upper surface that contacts the lower surface of the through electrode, and a second metal wiring electrically connected to an bottom surface of the contact pad.

The air gap has a shape whose gap width gradually increases in a direction toward the bottom surface.

BRIEF DESCRIPTION OF THE DRAWINGS

Exemplary embodiments will be more clearly understood from the following detailed description taken in conjunction with the accompanying drawings.

FIG. 1 is a cross-sectional view illustrating a semiconductor device in accordance with exemplary embodiments;

FIGS. 2 to 12 are cross-sectional views illustrating a method of manufacturing the semiconductor device of FIG. 1 in accordance with exemplary embodiments;

FIGS. 13 to 17 are cross-sectional views illustrating a method of manufacturing the semiconductor device of FIG. 1 in accordance with other exemplary embodiments;

FIG. 18 a cross-sectional view illustrating a semiconductor device in accordance with exemplary embodiments;

FIGS. 19 to 21 are cross-sectional views illustrating a method of manufacturing the semiconductor device of FIG. 18 in accordance with exemplary embodiments;

FIG. 22 is a cross-sectional view illustrating a multi-stacked semiconductor device in accordance with exemplary embodiments; and FIGS. 23 to 24 are cross-sectional views illustrating a method of manufacturing a multi-stacked semiconductor device in accordance with exemplary embodiments.

DETAILED DESCRIPTION OF THE EMBODIMENTS

Figure 1:
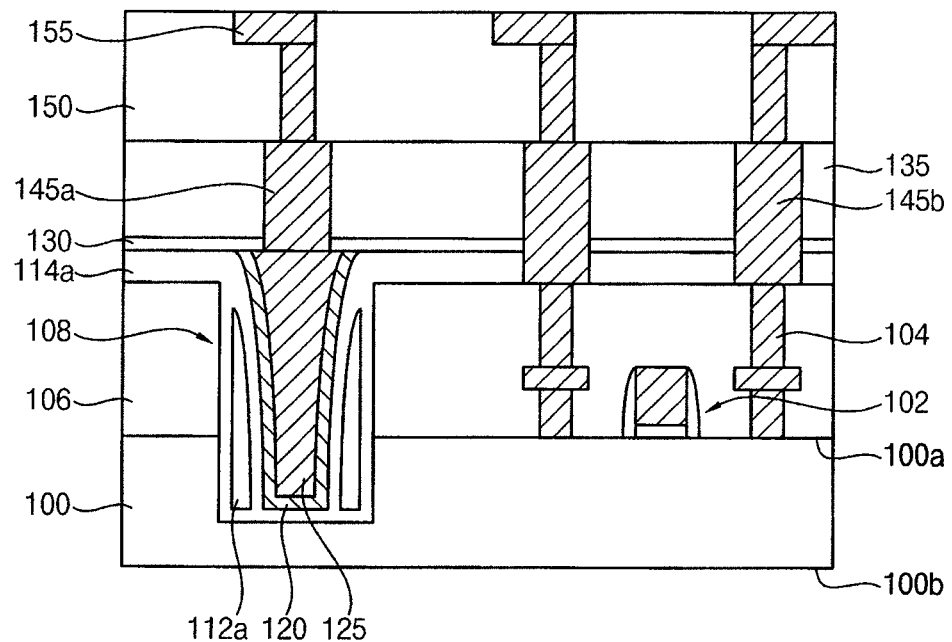
FIGS. 1 to 24 represent non-limiting, exemplary embodiments as described herein.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

FIG. 1 is a cross-sectional view illustrating a semiconductor device in accordance with exemplary embodiments.

Referring to FIG. 1, a substrate 100 having a circuit pattern 102 thereon may be provided. The substrate 100 may include a first surface 100a and a second surface 100b opposite to the first surface 100a. The substrate 100 may include a semiconductor substrate, e.g., a single-crystalline silicon substrate.

The circuit pattern 102 may be formed on the first surface 100a of the substrate 100. The circuit pattern 102 may include a transistor, a diode, etc. The circuit pattern 102 may include a plurality of memory devices. The memory devices may include a volatile memory device, e.g., a DRAM device, an SRAM device, etc., or a non-volatile memory device, e.g., an EPROM device, an EEPROM device, a flash memory device, etc.

An insulating interlayer 106 covering the circuit pattern 102 may be formed on the substrate 100. In exemplary embodiments, a plurality of circuit patterns 102 electrically connected to each other by contact plugs 104 including polysilicon or a metal may be formed.

A via hole 108 may be formed through the insulating interlayer 106, and the via hole 108 may extend to at a predetermined depth of the substrate 100. In exemplary embodiments, a plurality of via holes 108 may be formed in and on the substrate 100 defining a semiconductor chip.

An insulation layer structure 114a may be disposed on a sidewall and a bottom of the via hole 108 and on a top surface of the insulating interlayer 106. The insulation layer structure 114a may insulate the substrate 100 from conductive patterns filling the via hole 108.

The insulation layer pattern 114a may include an air gap 112a therein. The insulation layer patter 114a may reduce a parasitic capacitance between the substrate 100 and the conductive patterns filling the via hole 108 due to the air gap therein.

A barrier metal layer pattern 120 may be disposed on a portion of the insulation layer structure 114a in the via hole 108. The barrier metal layer pattern 120 may include tantalum (Ta), tantalum nitride (TaN), titanium (Ti), titanium nitride (TiN), ruthenium (Ru), cobalt (Co), nickel (Ni), nickel boride (NiB), tungsten nitride (WN), etc. These may be used alone or in a combination thereof.

A through electrode 125 may fill a remaining portion of the via hole 108 and may be disposed on the barrier metal layer pattern 120. The through electrode 125 may include a metal having a low resistance. In exemplary embodiments, the through electrode 125 may include copper (Cu) or tungsten (W).

A buffer layer 130 may be disposed on the barrier metal layer pattern 120, a through electrode 125 and the insulation layer structure 114a. The buffer layer 130 may prevent a conductive material of the through electrode 125 from being diffused. The buffer layer 130 may include silicon nitride (SiNx), silicon carbonitride (SiCN), and silicon oxycarbonitride (SiOCN). These may be used alone or in a combination thereof.

A first intermetallic dielectric (IMD) layer 135 may be disposed on the buffer layer 130. The first IMD layer 135 may include a material having a low dielectric constant. For example, the first IMD layer 135 may include silicon oxide, carbon-doped silicon oxide, etc.

A first metal wiring 145a electrically connected to the through electrode 125 may be formed through the first IMD layer 135 and the buffer layer 130. Second metal wirings 145b electrically connected to the contact plugs 104 may be formed through the first IMD layer 135, the buffer layer 130 and the insulation layer structure 114a.

A second IMD layer 150 may be disposed on the first IMD layer 135, the first metal wiring 145a and the second metal wirings 145b. Third metal wirings 155 electrically connected to the first metal wiring 145a and the second metal wirings 145b may be formed through the second IMD layer 150.

A third IMD layer (not illustrated) and a fourth metal wiring (not illustrated) may be further disposed on the second IMD layer 150 and the third metal wirings 155.

FIGS. 2 to 12 are cross-sectional views illustrating a method of manufacturing a semiconductor device in accordance with exemplary embodiments.

Figure 2:
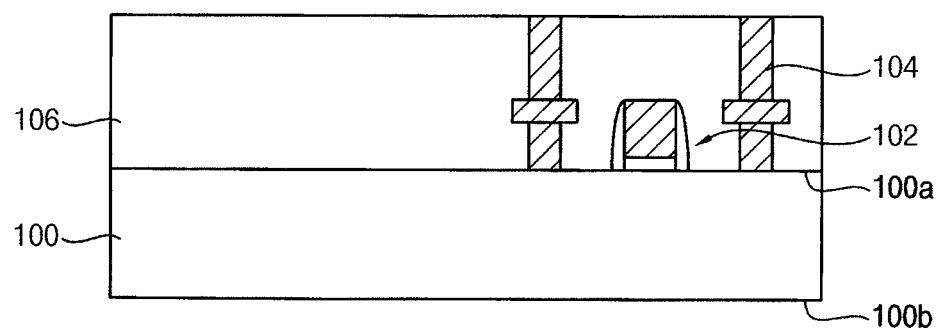

Referring to FIG. 2, a circuit pattern 102 may be formed on a first surface 100a of a substrate 100. An insulating interlayer 106 may be formed on the substrate 100 to cover the circuit pattern 102.

The substrate 100 may include a semiconductor substrate, e.g., a silicon substrate, a germanium substrate, a silicon-germanium substrate, a silicon-on-insulator (SOI) substrate, a germanium-on-insulator (GOI) substrate, etc. The substrate 100 may further include a well region (not illustrated) doped with p-type or n-type impurities.

The circuit pattern 102 may include CMOS transistors, diodes, capacitors, etc.

The insulating interlayer 106 may be formed using silicon oxide by a chemical vapor deposition (CVD) process, etc.

Contact plugs 104 may be formed through the insulating interlayer 106 to be electrically connected to at least a portion of the circuit pattern 102.

Particularly, a portion of the insulating interlayer 106 may be etched to form holes (not illustrated) partially exposing the circuit pattern 102. A metal layer may be formed to sufficiently fill the holes. An upper portion of the metal layer may be planarized until a top surface of the insulating interlayer 106 is exposed to form the contact plugs 104.

In exemplary embodiments, the metal layer may be formed using copper (Cu) and tungsten (W).

According to exemplary embodiments, a wafer process that may be referred to as a front-end-of-line (FEOL) process may be performed to form the circuit pattern 102 on the substrate 100. As illustrated later, in exemplary embodiments, after the circuit pattern 102 are formed on the substrate 100, a through electrode 125 (see FIG. 8) may be formed before performing a wiring process that may be referred to as a back-end-of-line (BEOL) process.

Figure 3:
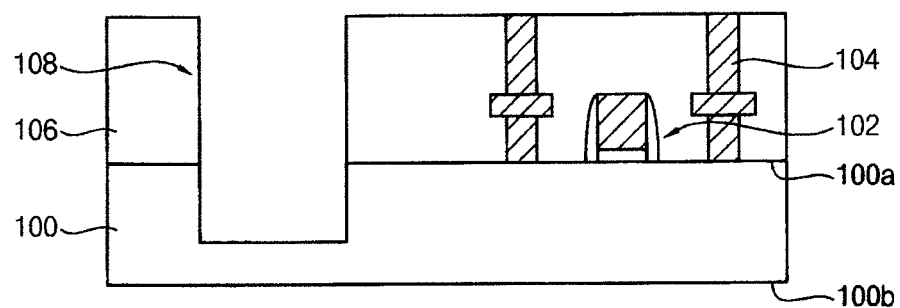

Referring to FIG. 3, a via hole 108 may be formed through the insulating interlayer 106 and at least an upper portion of the substrate 100. That is, the via hole 108 may penetrate the insulating interlayer 106 and extend to at a predetermined depth of the substrate 100. In exemplary embodiments, a sidewall of the via hole 108 may be defined by the insulating interlayer 106 and the substrate 100, and a bottom of the via hole 108 may be defined by the substrate 100.

Particularly, a photoresist pattern (not illustrated) may be formed on the insulating interlayer 106. Using the photoresist pattern as an etching mask, the insulating interlayer 106 may be etched to expose the substrate and an upper portion of the substrate 100 may be further etched to the predetermined depth of the substrate 100. The resultant etching profile of the insulating interlayer 106 and the substrate 100 forms the via hole 108.

Figure 4:
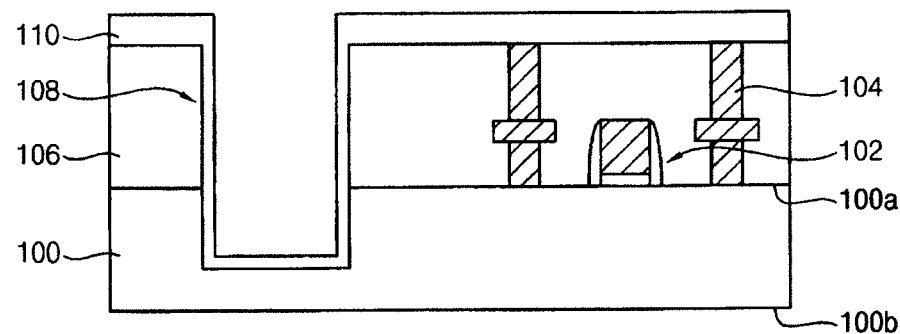

Referring to FIG. 4, a first insulation layer 110 may be formed conformally on the top surfaces of the insulating interlayer 106 and the contact plugs 104, and on the sidewall and the bottom of the via hole 108.

The first insulation layer 110 may be formed using silicon oxide or carbon-doped silicon oxide. The first insulation layer 100 may be formed by a plasma oxidation process or a CVD process. In exemplary embodiments, the first insulation layer 110 may be formed using tetra ethyl ortho silicate (TEOS) or ozone TEOS that may have a good step coverage characteristic. The first insulation layer 110 may insulate the substrate 100 from conductive patterns subsequently formed in the via hole 108.

Figure 5:
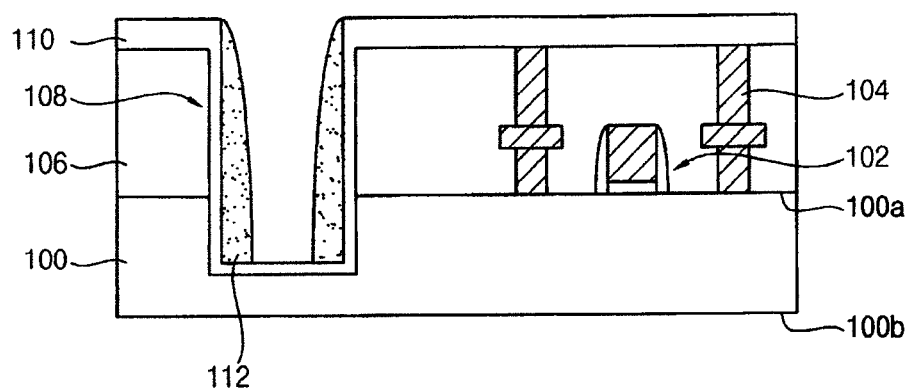

Referring to FIG. 5, a sacrificial layer pattern 112 may be formed on the sidewall of the via hole 108.

Particularly, a sacrificial layer may be formed on the first insulation layer 110, and the sacrificial layer may be anisotropically etched to form the sacrificial layer pattern 112. The sacrificial layer may be formed using a hydrocarbon-based (CxHy) material. In exemplary embodiments, the hydrocarbon-based material may include cyclo, bicyclo or bridged hydrocarbon materials. For example, the sacrificial layer may be formed using a terpine-based hydrocarbon or a norbornene-based hydrocarbon.

Figure 6:
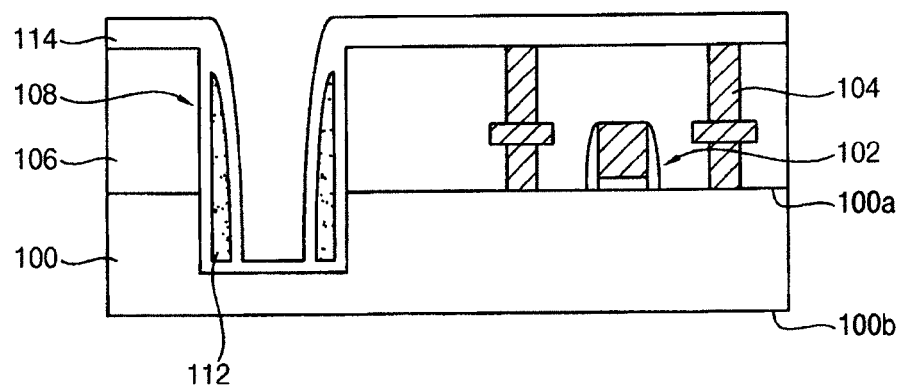

Referring to FIG. 6, a second insulation layer may be formed on the first insulation layer 110 and the sacrificial layer pattern 112 to form a preliminary insulation layer structure 114.

In exemplary embodiments, the second insulation layer may be formed using silicon oxide or carbon-doped silicon oxide. The second insulation layer may be formed using a material substantially the same as that of the first insulation layer 110. A portion of the second insulation layer formed on the first insulation layer 110 may be merged to the first insulation layer 110. Thus, the preliminary insulation layer structure 114 may be formed on the insulating interlayer 106 and on the sidewall and the bottom of the via hole 108. The preliminary insulation layer structure 114 may include the sacrificial layer pattern 112 therein, on the sidewall of the via hole 108.

Figure 7:
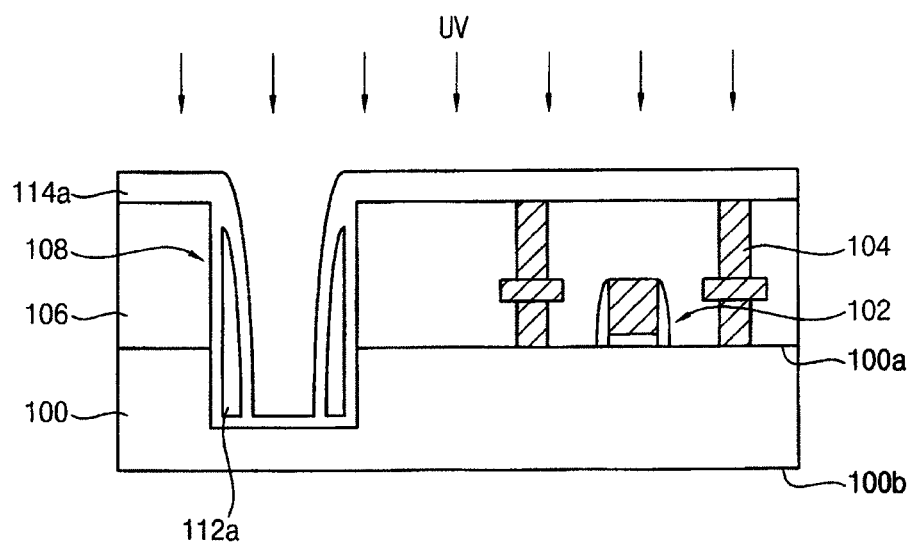

Referring to FIG. 7, the sacrificial layer pattern 112 may be removed to form an air gap 112a. Accordingly, an insulation layer structure 114a including the air gap 112a therein may be formed.

The sacrificial layer pattern 112 may be removed by performing a light radiation together with a heat treatment on the preliminary insulation layer structure 114. In exemplary embodiments, the light radiation may be performed using an UV light source having a wavelength of about 200 nm to about 350 nm. The hydrocarbon-based material of the sacrificial layer pattern 112 may undergo a bon-breakage and be volatized by the UV light. The volatized material may permeate through the insulation layer structure 114a and as a result, the sacrificial layer pattern 112 may be removed, which leaves behind an air gap 112a in the place of the sacrificial layer pattern 112. When the wavelength of the UV light is less than about 200 nm, the preliminary insulation layer structure 114 may be damaged. When the wavelength of the UV light is greater than about 350 nm, the sacrificial layer pattern 112 may not be easily removed.

In some exemplary embodiments, the light radiation may be performed at a temperature of about 300° C. to about 500° C. If the light radiation is performed at a temperature less than about 300° C., the sacrificial layer pattern 112 may not be easily removed. If the light radiation is performed at a temperature greater than about 500° C., the preliminary insulation layer structure 114 may be damaged.

In some exemplary embodiments, the sacrificial layer pattern 112 may be removed by an electron beam radiation process.

As illustrated in FIG. 7, the air gap 112a may be defined by a space from which the sacrificial layer pattern 112 is removed. The air gap has a shape whose gap width gradually increases in a direction toward the bottom of the via hole 108. Thus, a portion of the insulation layer pattern 114a may include an air gap 112a therein and be formed on the sidewall of the via hole 108.

Figure 8:
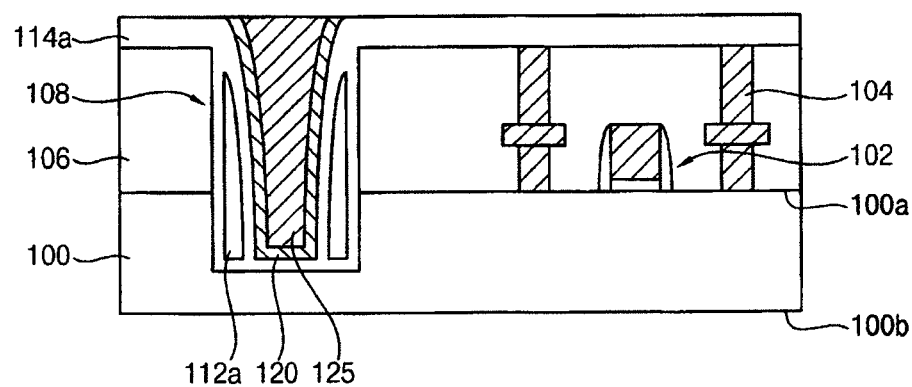

The air gap 112a may reduce a parasitic capacitance generated between the substrate 100 and a through electrode 125 (see FIG. 8).

Referring to FIG. 8, a barrier metal layer pattern 120 and a through electrode 125 may be formed on the insulation layer structure 114a to fill the via hole 108.

Particularly, a barrier metal layer may be formed on the insulation layer structure 114a. The barrier metal layer may be formed using tantalum (Ta), tantalum nitride (TaN), titanium (Ti), titanium nitride (TiN), ruthenium (Ru), cobalt (Co), nickel (Ni), nickel boride (NiB), tungsten nitride (WN), etc. These may be used alone or in a combination thereof.

A seed layer (not illustrated) may be formed on the barrier metal layer. The seed layer may serve as an electrode in a plating process for forming a conductive layer in a subsequent process. The seed layer may be formed using a metal such as copper (Cu), aluminum (Al), titanium (Ti), tantalum (Ta), tungsten (W), etc., by, e.g., a physical vapor deposition (PVD) process. For example, the seed layer may be formed using copper that has a low resistance.

The conductive layer may be formed on the seed layer to sufficiently fill the via hole 108. The conductive layer may be formed using a metal having a low resistance, e.g., copper. The conductive layer may be formed by an electro plating process, an electroless plating process, an electrografting process, etc. An annealing process may be further performed on the conductive layer.

Upper portions of the conductive layer and the barrier metal layer may be planarized by a chemical mechanical polishing (CMP) process or an etch-back process until a top surface of the insulation layer structure 114a is exposed to form the through electrode 125 and a barrier metal layer pattern 120, respectively.

Alternatively, a conductive layer may be formed on the insulation layer structure 114a to fill the via hole 108 by a CVD process, a PVD process, etc., and then an upper portion of the conductive layer may be planarized by a CMP process or a etch-back process to form the through electrode 125.

Figure 9:
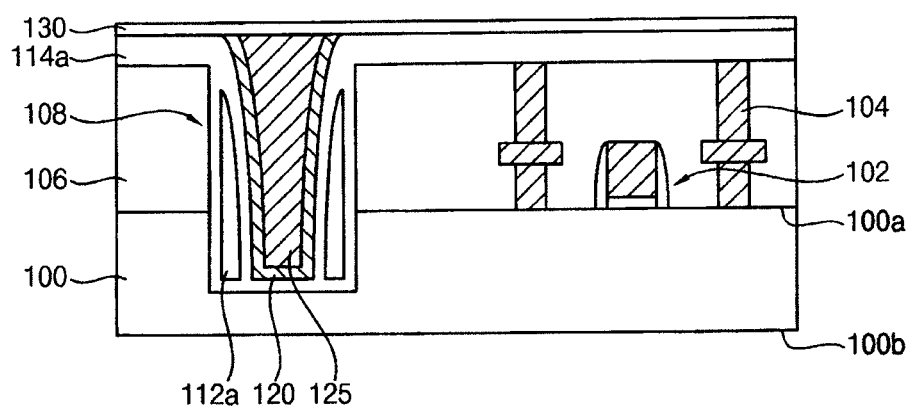

Referring to FIG. 9, a buffer layer 130 may be formed on the insulation layer structure 114a to cover the barrier metal layer pattern 120 and the through electrode 125. The buffer layer 130 may be formed using silicon nitride (SiNx), silicon carbonitride (SiCN), silicon oxycarbonitride (SiOCN). These may be used alone or in a combination thereof. The buffer layer 130 may prevent the conductive material of the through electrode 125 from being diffused.

Figure 10:
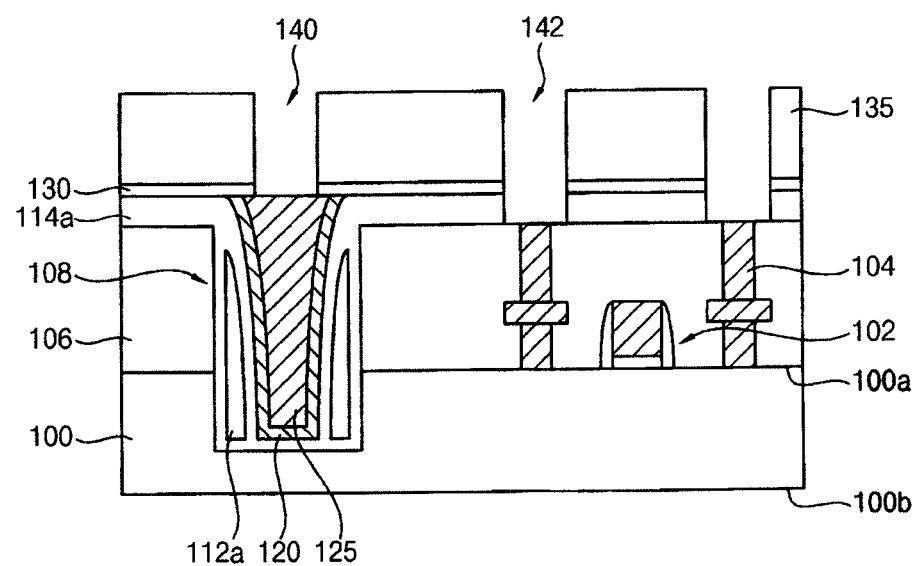

Referring to FIG. 10, first and second contact holes 140 and 142 may be formed. The first and second contact holes 140 and 142 may expose top surfaces of the through electrode 125 and the contact plug 104, respectively.

Specifically, a first intermetallic dielectric (IMD) layer 135 may be formed on the buffer layer 130. The first IMD layer 135 and the buffer layer 130 may be partially etched to form the first contact hole 140 by exposing the top surface of the through electrode 125. Additionally, the first IMD layer 135, the buffer layer 130 and the insulation layer structure 114a may be partially etched to form the second contact holes 142 by exposing the top surfaces of the contact plugs 104. In exemplary embodiments, the first and second contact holes 140 and 142 may be formed by a wet etching process.

Figure 11:
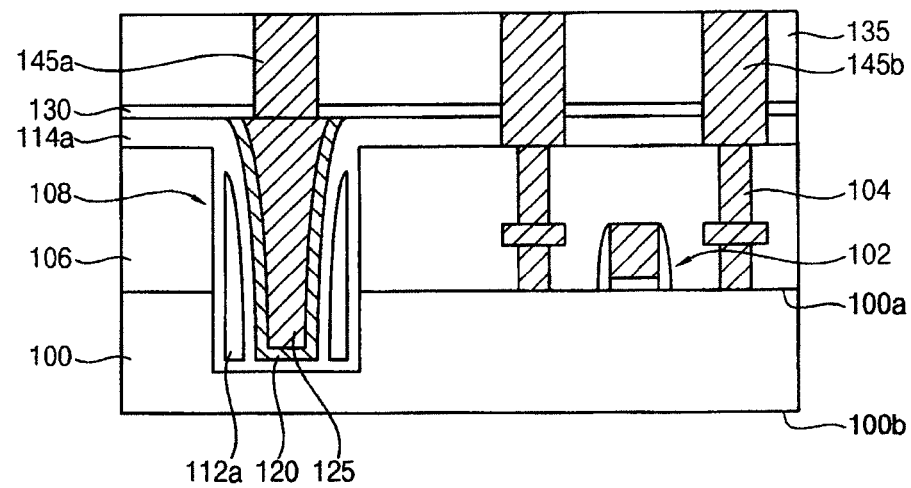

Referring to FIG. 11, first and second metal wirings 145a and 145b may be formed to fill the first and second contact holes 140 and 142, respectively. The first and second metal wirings 145a and 145b may be electrically connected to the through electrode 125 and the contact plugs 104, respectively.

Particularly, a conductive layer may be formed on the first IMD layer 135 to sufficiently fill the first and second contact holes 140 and 142. An upper portion of the conductive layer may be planarized until a top surface of the first IMD layer 135 is exposed to form the first and second metal wirings 145a and 145b.

Figure 12:
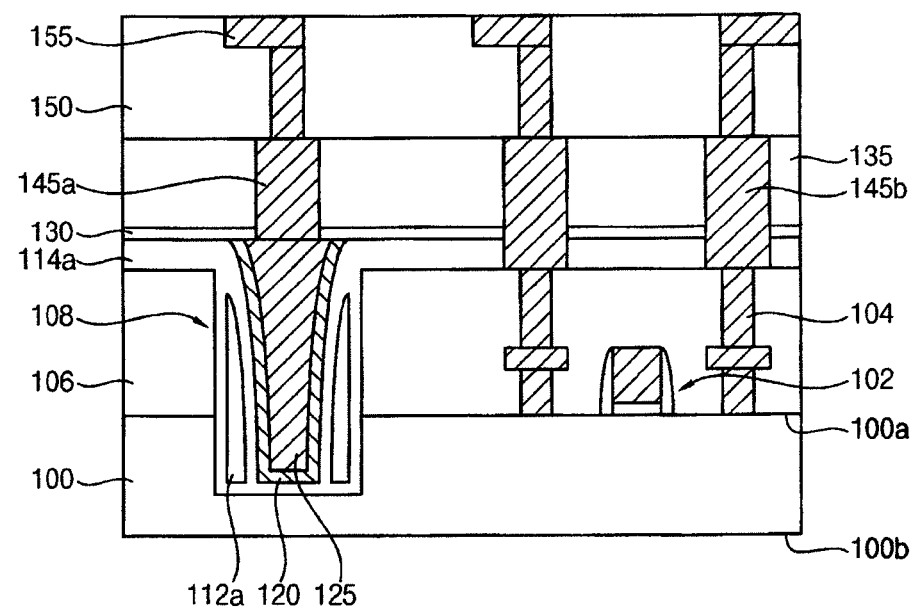

Referring to FIG. 12, a second IMD layer 150 and third metal wirings 155 may be formed on the first IMD layer 135, the first metal wiring 145a and the second metal wirings 145b.

Particularly, the second IMD layer 150 may be formed on the first IMD layer 135, the first metal wiring 145a and the second metal wirings 145b. The second IMD layer 150 may be partially etched to form third contact holes (not illustrated) by exposing the first and second metal wirings 145a and 145b. The third metal wirings 155 may be formed by filling the third contact holes with a conductive material to be electrically connected to the first and second metal wirings 145a and 145b.

A third IMD layer (not illustrated) and a fourth metal wiring (not illustrated) may be further formed on the second IMD layer 150 and the third metal wiring 155

FIGS. 13 to 17 are cross-sectional views illustrating a method of manufacturing the semiconductor device of FIG. 1 in accordance with other exemplary embodiments.

The method illustrated with reference to FIGS. 13 to 17 may be substantially the same as or similar to that illustrated with reference to FIGS. 2 to 12 except for processes for forming contact plugs 104. Thus, like reference numerals refer to like elements, and repetitive explanations are omitted here.

Figure 13:
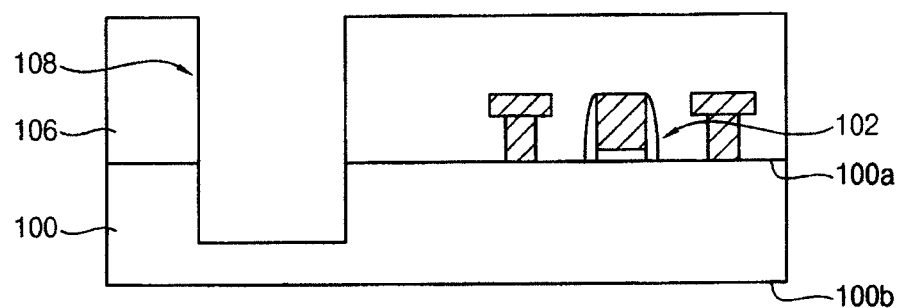

Referring to FIG. 13, a circuit pattern 102 may be formed on a first surface 100a of a substrate 100, and an insulating interlayer 106 may be formed on the substrate 100 to cover the circuit pattern 102.

A via hole 108 may be formed to penetrate the insulating interlayer 106 and extend to at a predetermined depth of the substrate 100.

Figure 14:
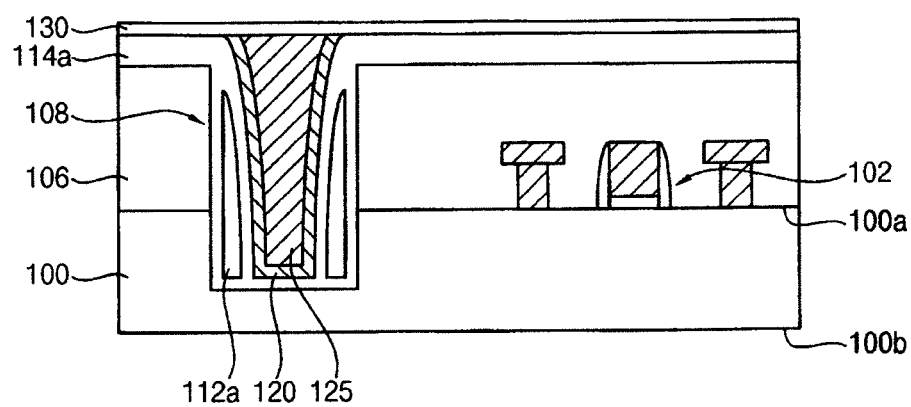

Referring to FIG. 14, processes substantially the same as or similar to those illustrated with reference to FIGS. 4 to 9 may be performed, thereby to form an insulation layer structure 114a including an air gap 112a therein, a barrier metal layer pattern 120 and a through electrode 125 that may fill the via hole 108. A buffer layer 130 may be formed on the insulation layer structure 114a, the barrier metal layer pattern 120 and the through electrode 125.

Figure 15:
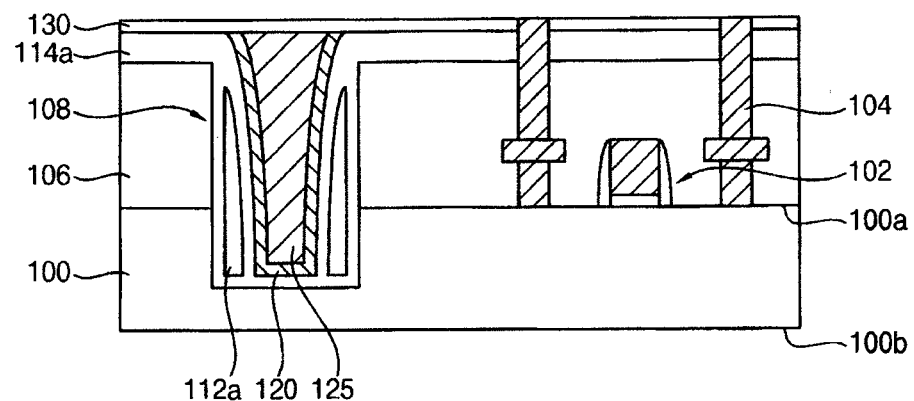

Referring to FIG. 15, contact plugs 104 connected to at least a portion of the circuit pattern 102 may be formed through the buffer layer 130, the insulation layer structure 114a and the insulating interlayer 106.

Specifically, the buffer layer 130, the insulation layer structure 114a and the insulating interlayer 106 may be partially and sequentially etched to form holes (not illustrated) exposing the circuit pattern 102. A conductive layer may be formed on the exposed circuit pattern 102 and the buffer layer 130 to fill the holes, and an upper portion of the conductive layer may be planarized to form the contact plugs 104. In exemplary embodiments, the conductive layer may be formed using copper or tungsten.

In some exemplary embodiments, a barrier metal layer may be formed on a sidewall and a bottom of the hole prior to forming the conductive layer.

A FEOL process may be completed by forming the contact plugs 104, and a BEOL process may be subsequently performed to form metal wirings.

Figure 16:
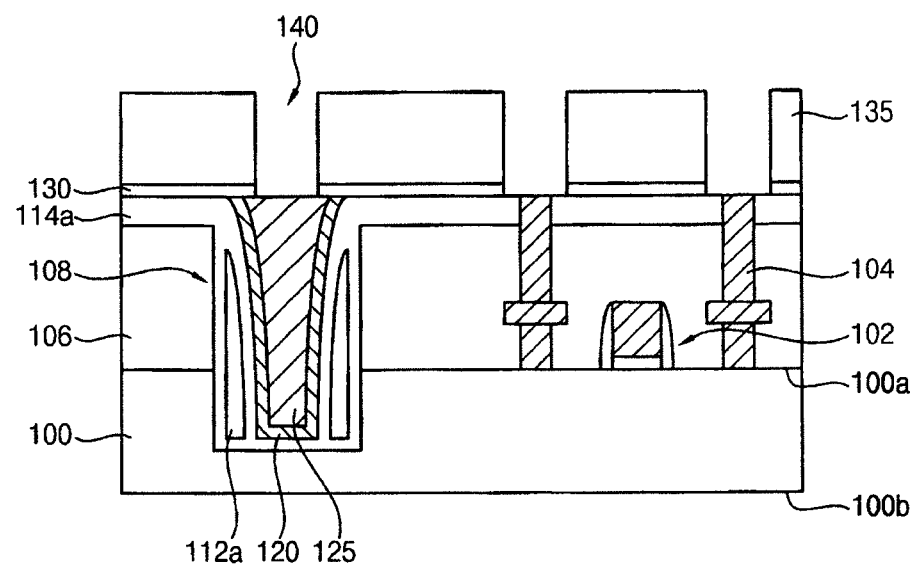

Referring to FIG. 16, a plurality of contact holes 140 may be formed to expose top surfaces of the through electrode 125 and the contact plugs 104. In exemplary embodiments, at least one of the contact holes 140 may expose the top surface of the through electrode 125, and other contact holes 140 may expose the top surfaces of the contact plugs 104.

Specifically, a first IMD layer 135 may be formed on the buffer layer 130 and the contact plugs 104. The first IMD layer 135 and the buffer layer 130 may be partially etched to form the contact holes 140. Upper portions of the contact plugs 104 may be removed together with the buffer layer 130 so that the top surfaces of the through electrode 125 and the contact plugs 104 may be coplanar with that of the insulation layer structure 114a.

In exemplary embodiments, the contact holes 140 may be formed by a dry etching process.

Figure 17:
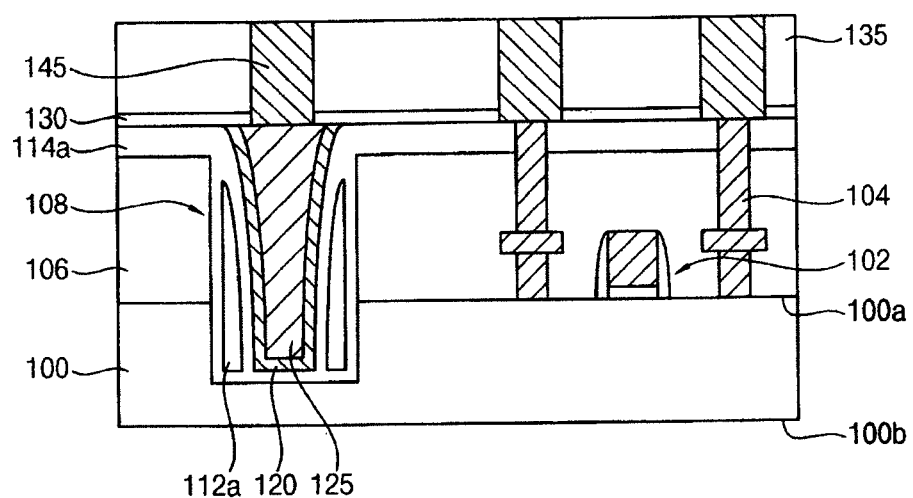

Referring to FIG. 17, first metal wirings 145 filling the contact holes 140 may be formed to be electrically connected to the through electrode 125 and the contact plugs 104.

Processes substantially the same as or similar to those illustrated with reference to FIG. 12 may be performed to form a second IMD layer (not illustrated) and second metal wirings (not illustrated) on the first IMD layer and the first metal wirings. A third IMD layer (not illustrated) and third metal wirings (not illustrated) may be further formed by substantially the same processes.

Figure 18:
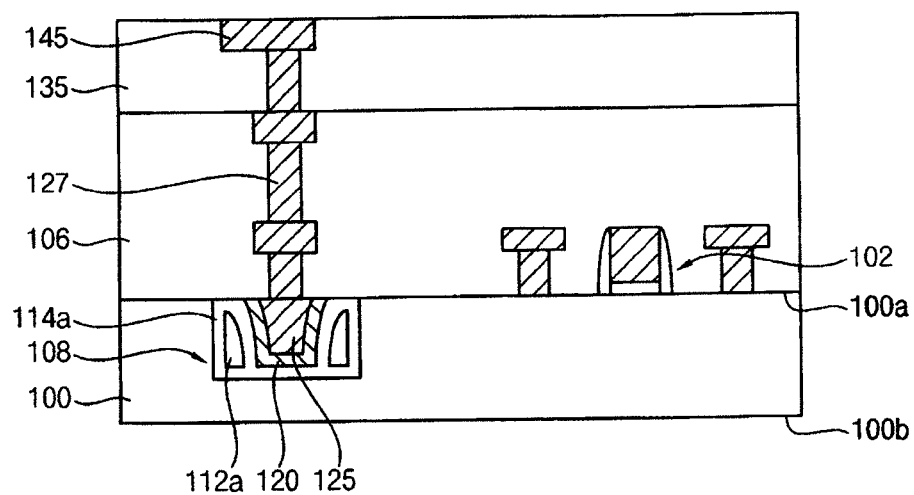

FIG. 18 is a cross-sectional view illustrating a semiconductor device in accordance with other exemplary embodiments.

The semiconductor device of FIG. 18 may include a via hole 108 extending from a first surface 100a of a substrate 100 to at a predetermined depth of the substrate 100 in a direction substantially perpendicular to the first surface 100a of the substrate 100.

An insulation layer structure 114a including an air gap 112a therein may be formed on a sidewall and a bottom of the via hole 108. A barrier metal layer pattern 120 may be disposed on the insulation layer structure 114a. A through electrode 125 may be disposed on the barrier metal layer 120 to fill a remaining portion of the via hole 108.

A circuit pattern 102 may be disposed on the substrate 100, and an insulating interlayer 106 covering the circuit pattern 102 may be formed on the substrate 100. The insulating interlayer 106 may include a lower wiring 127 electrically connected to the through electrode 125.

A first IMD layer 135 containing a first metal wiring 145 electrically connected to the lower wiring 127 may be disposed on the insulating interlayer 106 and the lower wiring 127.

A plurality of IMD layers and metal wirings (not illustrated) may be further disposed on the first IMD layer 135 and the first metal wiring 145.

Figure 19:
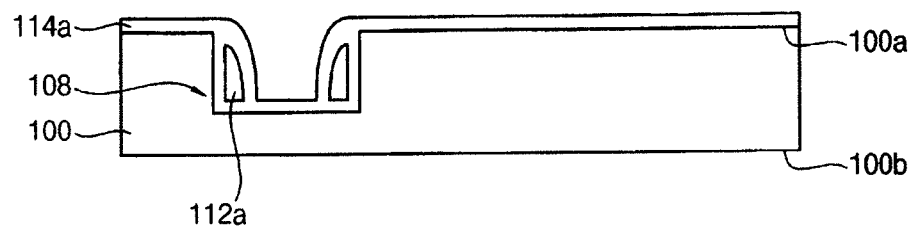
Figure 20:
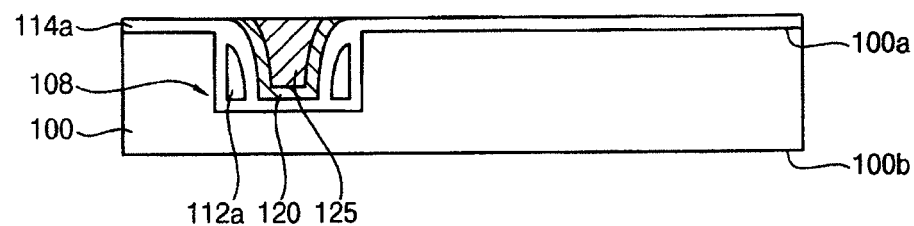
Figure 21:
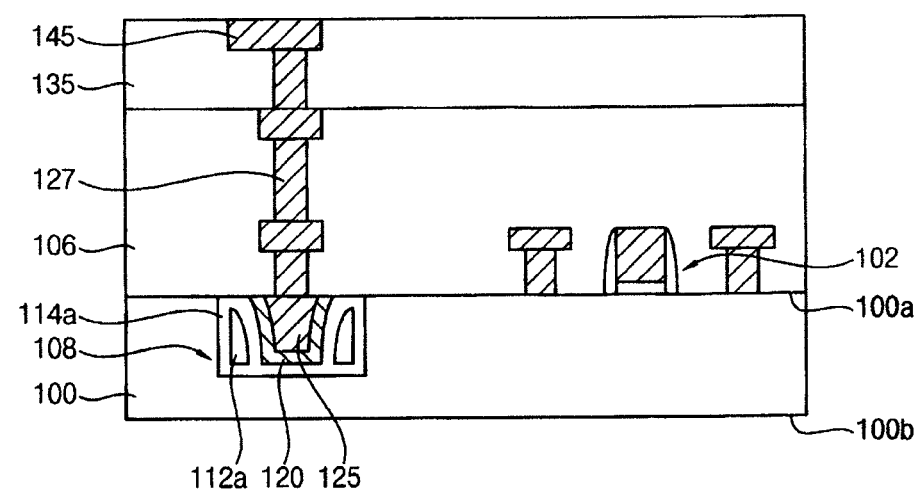

FIGS. 19 to 21 are cross-sectional views illustrating a method of manufacturing the semiconductor device of FIG. 18 in accordance with still other exemplary embodiments.

Referring to FIG. 19, a via hole 108 may be formed to extend from a first surface 100a of a substrate 100 to at a predetermined depth of the substrate 100 in a direction substantially perpendicular to the first surface 100a of the substrate 100. An insulation layer structure 114a may be formed conformally on the first surface 100a of the substrate 100 and a sidewall and a bottom of the via hole 108. A portion of the insulation layer structure 114a formed on the sidewall of the via hole 108 may include an air gap 112a therein.

The insulation layer structure 114a and the air gap 112a may be formed by performing processes substantially the same as or similar to those illustrated with reference to FIGS. 4 to 7.

Thus, detailed explanations are omitted here.

Referring to FIG. 20, a barrier metal layer pattern 120 and a through electrode 125 may be formed by performing processes substantially the same as or similar to those illustrated with reference to FIG. 8.

Referring to FIG. 21, a lower wiring 127 may be formed to electrically connect to the through electrode 125 and a first metal wiring 145.

Specifically, upper portions of the insulation layer structure 114a, the barrier metal layer pattern 120 and the through electrode 125 may be planarized to expose the first surface 100a of the substrate 100.

A circuit pattern 102 may be formed on the first surface 100a of the substrate 100, and an insulating interlayer 106 covering the circuit pattern 102 may be formed on the substrate 100. The lower wiring 127 may be formed through the insulating interlayer 106 to be electrically connected to the through electrode 125.

A first IMD layer 135 may be formed on the insulating interlayer 106 and the lower wiring 127. The first metal wiring 145 may be formed through the first IMD layer 135 to be electrically connected to the lower wiring 127.

A plurality of IMD layers and metal wirings (not illustrated) may be further formed on the first IMD layer 135 and the first metal wiring 145.

Figure 22:
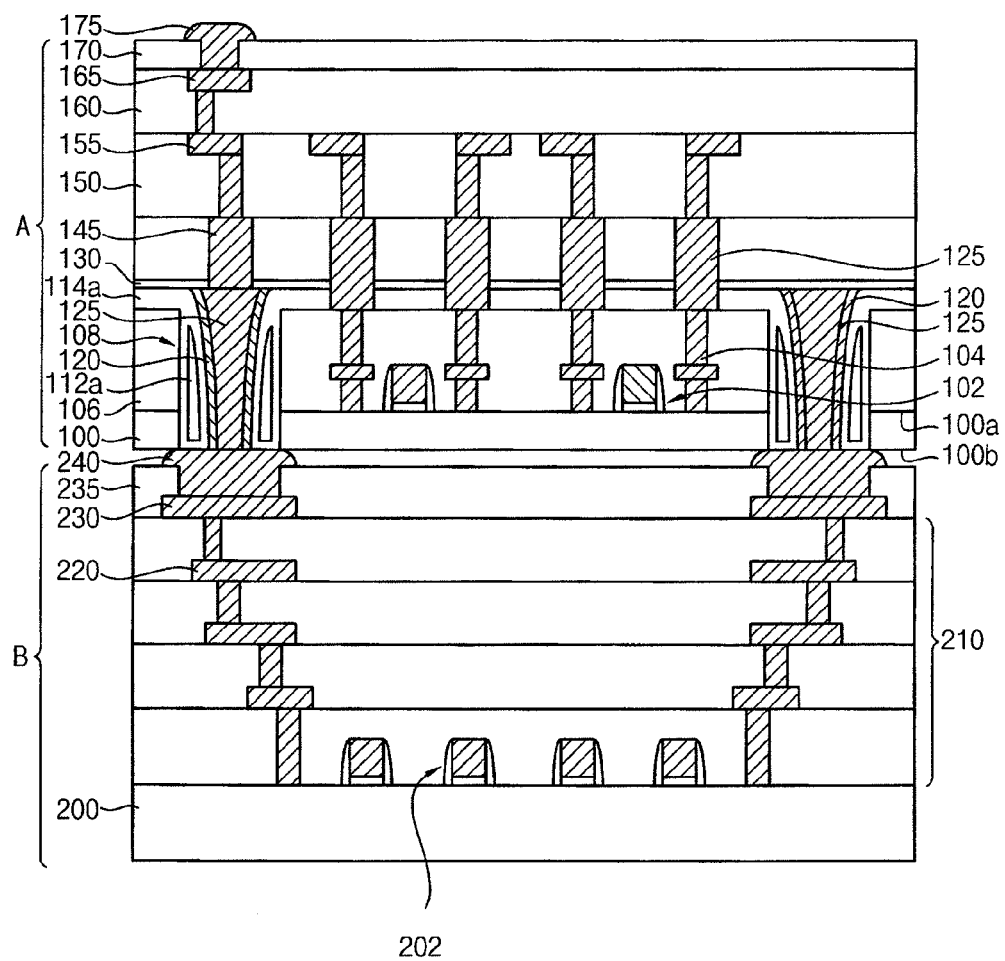

FIG. 22 is a cross-sectional view illustrating a multi-stacked semiconductor device in accordance with exemplary embodiments.

Referring to FIG. 22, the multi-stacked semiconductor device may include a first semiconductor chip A, a second semiconductor chip B, and contact pads 175 and 240.

The first semiconductor chip A may include a circuit pattern 102. The circuit pattern 102 may include a memory device, a logic device or an image device. The first semiconductor chip A may be formed on a first substrate 100. The first semiconductor chip A may have a structure substantially the same as that of the semiconductor device illustrated in FIG. 1 except for the shape of a barrier metal layer pattern 120 and a through electrode 125. Specifically, bottoms of the barrier metal layer pattern 120 and the through electrode 125 may be exposed at a second surface 100b of the first substrate 100. Other repetitive explanations on like elements are omitted here.

In exemplary embodiments, the second surface 100b of the substrate 100 may be polished until the bottom of the through electrode 125 is exposed, so that the bottoms of the barrier metal layer pattern 120 and the through electrode 125 may be exposed.

A third IMD layer 160 and a third metal wiring 165 may be disposed at an uppermost portion of the first semiconductor chip A, and a first protection layer 170 may be disposed on the third IMD layer 160 and the third metal wiring 165. The first protection layer 170 may include an insulating material, e.g., polyimide. The first protection layer 170 may include a first contact pad 175 electrically connected to the third metal wiring 165. The third metal wiring 165 may serve as a pad electrode, and thus third metal wiring 165 may be referred to as a first pad electrode, hereinafter.

The first contact pad 175 may make contact with a printed circuit board (PCB). Alternatively, the first pad electrode 165 may be electrically connected to a lead frame by a wire bonding.

The second semiconductor chip B may include a second substrate 200, a second circuit pattern 202 disposed on the second substrate 200, wirings 220, a plurality of insulating interlayers 210 and a second pad electrode 230 to which external signals may be applied through the through electrode 125.

The second semiconductor chip B may include a semiconductor device substantially the same as or different from that of the first semiconductor chip A.

As illustrated in FIG. 22, the second pad electrode 230 electrically connected to the wirings 220 may be disposed in the uppermost insulating interlayer 210 of the second semiconductor chip B. The second pad electrode 230 may make contact with the bottom of the through electrode 125 of the first semiconductor chip A.

A second protection layer 235 may be disposed on the uppermost insulating interlayer 210 and the second pad electrode 230. The second protection layer 235 may include polyimide.

A second contact pad 240 may be formed through the second protection layer 235. The second contact pad 240 may make contact with the through electrode 125 and the second pad electrode 230, so that the through electrode 125 and the second pad electrode 230 may be electrically connected to each other. The second contact pad 240 may include silver solder paste.

The multi-stacked semiconductor device illustrated in FIG. 22 may have a reduced parasitic capacitance due to the air gap 112a formed in the insulation layer structure 114a so that the multi-stacked semiconductor device may have high quality chip-to-chip signal integrity with a signal frequency increasing.

In some exemplary embodiments, at least three of the first semiconductor chip A including the through electrode 125 may be stacked in a vertical direction. In this case, the bottom of the through electrode 125 in each semiconductor chip may make electrical contact with a pad electrode of another semiconductor chip by a solder or a bump, etc.

Figure 23:
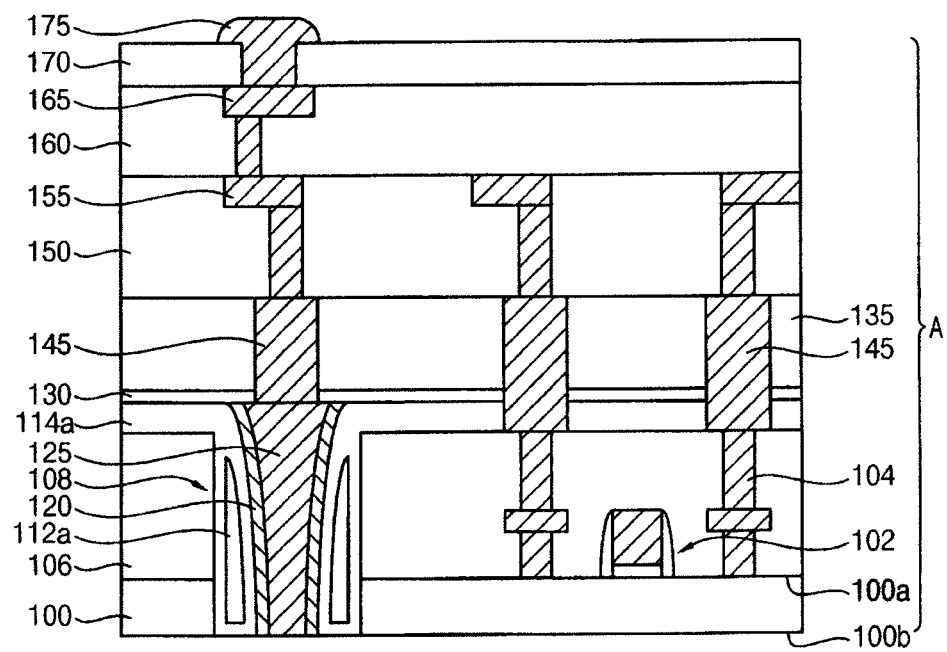
Figure 24:
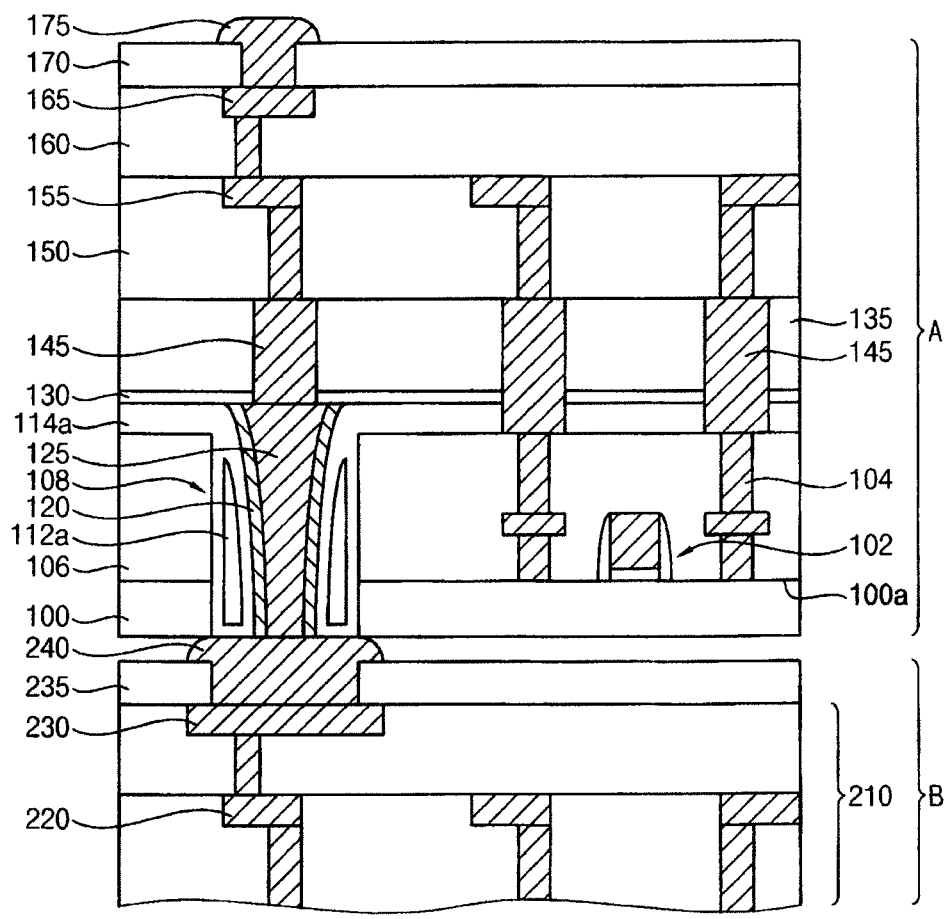

FIGS. 23 to 24 are cross-sectional views illustrating a method of manufacturing the multi-stacked semiconductor device of FIG. 22.

Referring to FIG. 23, process substantially the same as or similar to those illustrated with reference to FIGS. 2 to 12 may be performed to manufacture a semiconductor device that may include an insulation layer structure 114a having an air gap 112a therein, a through electrode 125 on a portion of the insulation layer structure 114a and first to third metal wirings 145, 155 and 165 electrically connected to the through electrode 125.

A first protection layer 170 may be formed on an uppermost IMD layer 160 and the third metal wiring 165 using polyimide.

The first protection layer 170 may be partially removed to form an opening exposing the third metal wiring 165. A first contact pad 175 filling the opening may be formed on the first protection layer 170 to contact the third metal wiring 165.

A second surface 100b of the substrate 100 may be polished to expose bottoms of the through electrode 125 and a barrier metal layer pattern 120 to form a first semiconductor chip A.

Referring to FIG. 24, the first semiconductor chip A may be stacked on a second semiconductor chip B by attaching the through electrode 125 to a second contact pad 240 of the second semiconductor chip B. As a result, the multi-stacked semiconductor device including the first and second semiconductor chips A and B may be manufactured.

The second semiconductor chip B may be a semiconductor device substantially the same as or different from the first semiconductor chip A.

In some exemplary embodiments, a bump (not shown) may be attached to the second contact pad 240, and the first semiconductor chip A may be stacked on the second semiconductor chip B using the bump.

Additionally, another semiconductor chip may be also stacked on the first semiconductor chip A using the first contact pad 175.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A semiconductor device, comprising:
a substrate having a first surface and a second surface opposite to the first surface;
a circuit pattern disposed on the second surface of the substrate;
an insulating interlayer disposed on the second surface of the substrate;
a via hole penetrating the substrate and the insulating interlayer;
an insulation layer structure disposed on an inner sidewall of the via hole and on a top surface of the insulating interlayer, the insulation layer structure having a single layer and including an air gap completely embedded within the single layer;
a through electrode including a first surface and a second surface opposite to the first surface of the through electrode, wherein the through electrode is disposed on the insulation layer structure and fills the via hole, and the first surface of the through electrode is level with the first surface of the substrate; and
a metal wiring disposed on the second surface of the through electrode.

2. The semiconductor device claim 1, wherein the insulation layer structure includes silicon oxide or carbon-doped silicon oxide.

3. The semiconductor device claim 1, wherein the air gap has a shape whose gap width gradually increases in a direction toward the bottom surface.

4. A multi-stacked semiconductor device, comprising:
a first semiconductor device comprising:
a top surface,
a bottom surface,
a through electrode having an upper surface and a lower surface, wherein the lower surface is at the same level with the bottom surface,
an insulation layer structure disposed on a sidewall of the through electrode, the insulation layer structure having a single layer and having an air gap completely embedded in the single layer, and
a first metal wiring electrically connected to the upper surface of the through electrode; and
a second semiconductor device comprising:
a contact pad having an upper surface, the upper surface contacting the lower surface of the through electrode; and
a second metal wiring electrically connected to a bottom surface of the contact pad.

5. The semiconductor device claim 4, wherein the air gap has a shape whose gap width gradually increases in a direction toward the bottom surface.

* * * * *